US011758653B2

(12) United States Patent
Kim et al.

(10) Patent No.: US 11,758,653 B2
(45) Date of Patent: Sep. 12, 2023

(54) PRINTED CIRCUIT BOARD

(71) Applicant: SAMSUNG ELECTRO-MECHANICS CO., LTD., Suwon-si (KR)

(72) Inventors: Sang Hoon Kim, Suwon-si (KR); Yong Duk Lee, Suwon-si (KR); Duck Young Maeng, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 3 days.

(21) Appl. No.: 17/222,528

(22) Filed: Apr. 5, 2021

(65) Prior Publication Data

US 2022/0174816 A1 Jun. 2, 2022

(30) Foreign Application Priority Data

Nov. 30, 2020 (KR) .................. 10-2020-0164562

(51) Int. Cl.
*H05K 1/11* (2006.01)

(52) U.S. Cl.
CPC ... *H05K 1/113* (2013.01); *H05K 2201/09563* (2013.01)

(58) Field of Classification Search
CPC . H05K 1/11; H05K 1/113; H05K 2201/09563
USPC ........................................................ 174/261
See application file for complete search history.

(56) References Cited

FOREIGN PATENT DOCUMENTS

| KR | 10-2014-0146447 A | 12/2014 |
| KR | 10-2017-0086921 A | 7/2017 |
| KR | 10-2018-0036871 A | 4/2018 |

*Primary Examiner* — Tremesha S Willis
(74) *Attorney, Agent, or Firm* — Morgan, Lewis & Bockius LLP

(57) ABSTRACT

A printed circuit board includes a first substrate portion including a first insulating layer and a first wiring layer; and a second substrate portion disposed on the first substrate portion and including a second insulating layer, a pad disposed on the second insulating layer, and a first via penetrating through the second insulating layer and connecting the first wiring layer and the pad to each other. The first via has a boundary with each of the first wiring layer and the pad, and includes a first metal layer and a second metal layer disposed on different levels.

29 Claims, 29 Drawing Sheets

PRINTED CIRCUIT BOARD

CROSS-REFERENCE TO RELATED APPLICATION(S)

This application claims the benefit of priority to Korean Patent Application No. 10-2020-0164562 filed on Nov. 30, 2020 in the Korean Intellectual Property Office, the disclosure of which is incorporated herein by reference in its entirety.

TECHNICAL FIELD

The present disclosure relates to a printed circuit board.

BACKGROUND

With the continuous implementation of high performance in mobile application processors (APs) and the miniaturization of semiconductor nodes, the implementation of microcircuits and micro-vias is also required in a printed circuit board on which the mobile application processor and the semiconductor nodes are mounted.

In addition, in the case in which a plurality of electronic components are mounted on the printed circuit board, since a plurality of electronic components disposed in a short distance on the same board should be connected to each other, the demand for microcircuits and micro-vias is further increased.

SUMMARY

An aspect of the present disclosure may provide a printed circuit board including microcircuits and/or micro-vias.

Another aspect of the present disclosure may provide a printed circuit board capable of securing a sufficient design area of a microcircuit.

Another aspect of the present disclosure may provide a printed circuit board having an improved heat dissipation effect.

Another aspect of the present disclosure may provide a printed circuit board capable of preventing a side effect of additionally etching a wiring layer when a seed layer is etched.

According to an aspect of the present disclosure, a printed circuit board may include a first substrate portion including a first insulating layer and a first wiring layer; and a second substrate portion disposed on the first substrate portion and including a second insulating layer, a pad disposed on the second insulating layer, and a first via penetrating through the second insulating layer and connecting the first wiring layer and the pad to each other. The first via may have a boundary with each of the first wiring layer and the pad, and include a first metal layer and a second metal layer disposed on different levels.

According to another aspect of the present disclosure, a printed circuit board may include a plurality of insulating layers; a plurality of wiring layers respectively disposed on the plurality of insulating layers; a pad disposed on a side opposite to a side of a first insulating layer disposed on an uppermost side among the plurality of insulating layers on which a first wiring layer among the plurality of wiring layers is disposed; a plurality of first vias penetrating through each of the remaining insulating layers except for the first insulating layer among the plurality of insulating layers and connecting wiring layers disposed on different layers among the plurality of wiring layers to each other; and a second via penetrating through the first insulating layer and connecting the first wiring layer disposed on the first insulating layer and the pad to each other. The second via may have a maximum diameter smaller than that of the first via.

According to another aspect of the present disclosure, a printed circuit board may include a first substrate portion including a first insulating layer, a first wiring layer, and a first via disposed in the first insulating layer and connected to the first wiring layer; and a second substrate portion disposed on one side of the first substrate portion and including a second insulating layer, a pad disposed on the second insulating layer, and a second via disposed in the second insulating layer and connecting the first wiring layer and the pad to each other. An angle of inclination of a side surface of the first via with respect to an upper surface of the first insulating layer facing the second insulating layer may be less than an angle of inclination of a side surface of the second via with respect to the upper surface of the first insulating layer.

According to another aspect of the present disclosure, a printed circuit board may include a first substrate portion including a first insulating layer, a first wiring layer, and a first via disposed in the first insulating layer and connected to the first wiring layer; and a second substrate portion disposed on one side of the first substrate portion and including a second insulating layer, a pad disposed on the second insulating layer, and a second via disposed in the second insulating layer and connecting the first wiring layer and the pad to each other. The number of metal layers being in contact with the first insulating layer and included in the first via may be less than the number of metal layers being in contact with the second insulating layer and included in the second via.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
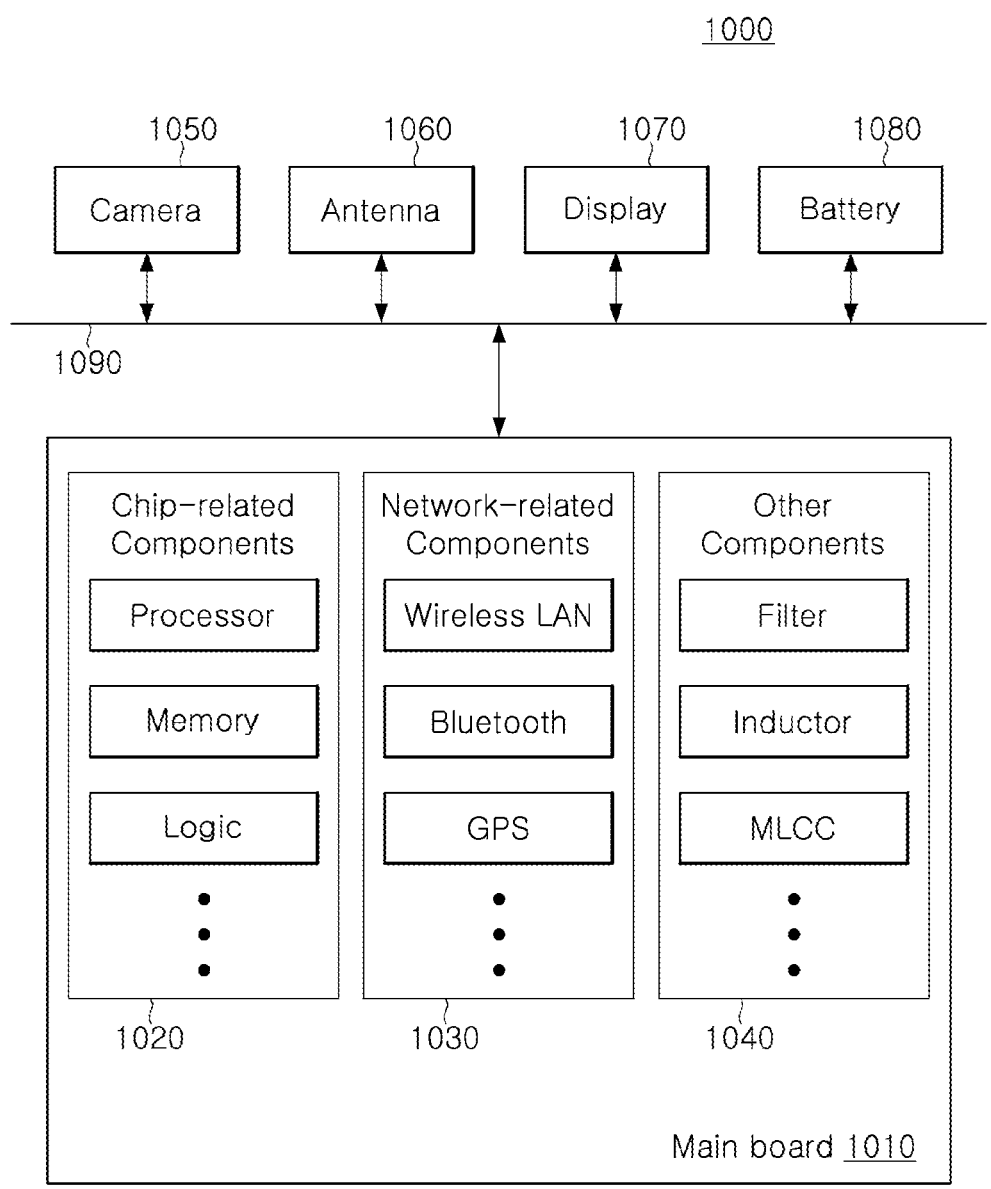
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related electronic components. In addition, the chip related components 1020 may be combined with each other. The chip related components 1020 may be in the form of a package including the above-described chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access + (HSPA+), high speed downlink packet access + (HSDPA+), high speed uplink packet access + (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components in the form of a chip component used for various other purposes, and the like. In addition, other components 1040 may be combined with the chip related components 1020 and/or the network related components 1030 described above.

Depending on a type of the electronic device 1000, the electronic device 1000 may include other electronic components that may or may not be physically and/or electrically connected to the main board 1010. Examples of other electronic components may include a camera module 1050, an antenna module 1060, a display 1070, a battery 1080, and the like. However, other electronic components are not limited thereto, and may also include an audio codec, a video codec, a power amplifier, a compass, an accelerometer, a gyroscope, a speaker, a mass storage device (e.g., a hard disk drive), a compact disk (CD), a digital versatile disk (DVD), and the like. In addition, other electronic components used for various purposes may be included according to the type of the electronic device 1000.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, and may be any other electronic device that processes data.

Figure 2:
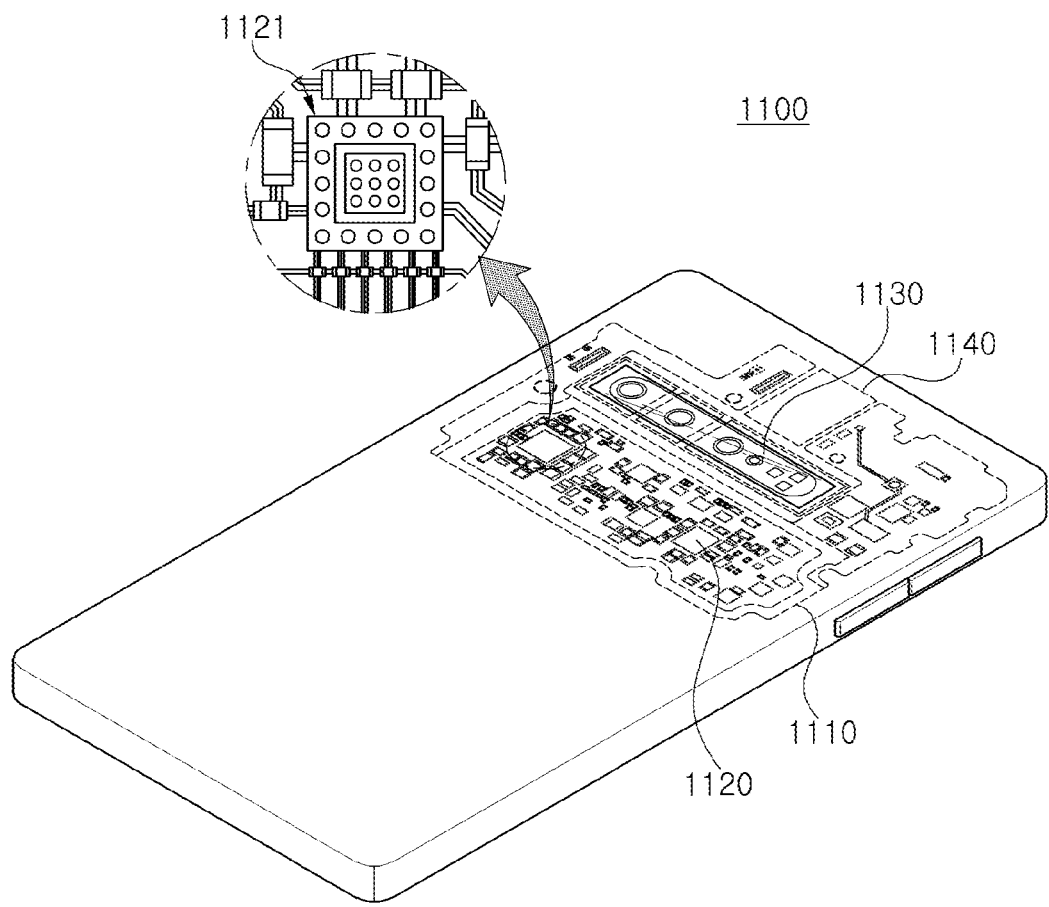
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A main board 1110 may be accommodated in the smartphone 1100, and various electronic components 1120 may be physically and/or electrically connected to the main board 1110. In addition, other electronic components that may or may not be physically and/or electrically connected to the main board 1110, such as the camera module 1130 and/or the speaker 1140, may be accommodated in the smartphone 1100. Some of the electronic components 1120 may be the chip related components described above, for example, an antenna module 1121, but are not limited thereto. The antenna module 1121 may be in a form in which the electronic component is surface mounted on the printed circuit board, but is not limited thereto. On the other hand, the electronic device is not necessarily limited to the smartphone 1100, but may be other electronic devices as described above.

Printed Circuit Board

Figure 3:
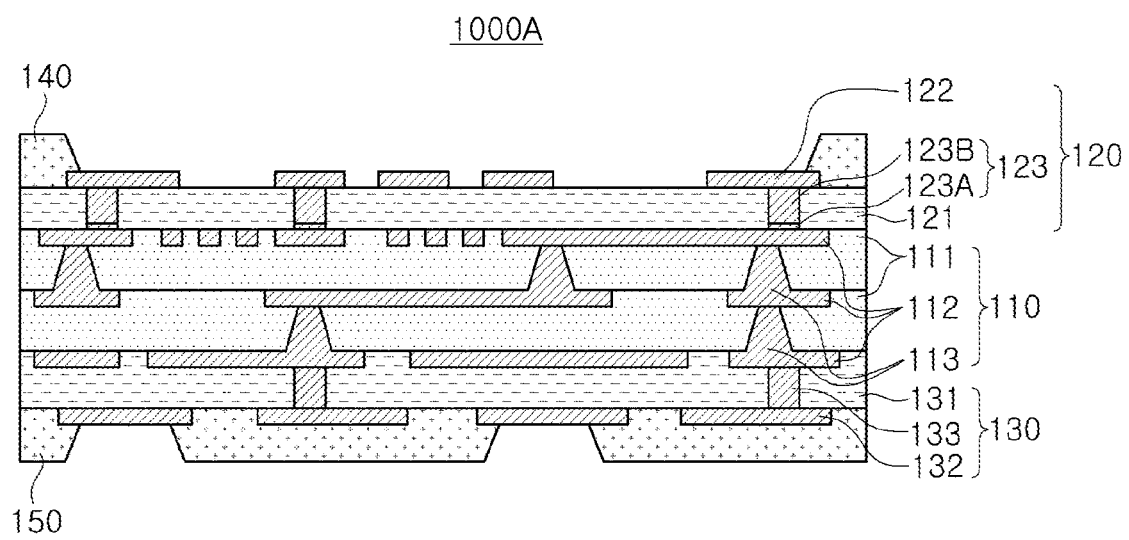
FIG. 3 is a schematic cross-sectional view illustrating an example of a printed circuit board according to the present disclosure.

FIG. 3 is a schematic cross-sectional view illustrating an example of a printed circuit board according to the present disclosure.

Referring to FIG. 3, a printed circuit board 1000A may include a first substrate portion 110 and a second substrate portion 120. In addition, the printed circuit board 1000A may further include at least one of a third substrate portion 130, a first protective layer 140, and a second protective layer 150.

The first substrate portion 110 may include a first insulating layer 111, a first wiring layer 112, and a first via 113.

The first substrate portion 110 may have a multilayer structure. Therefore, each of the first insulating layer 111, the first wiring layer 112, and the first via 113 may be a plurality of first insulating layers 111, a plurality of first wiring layers 112, and a plurality of first vias 113.

As a material for forming the first insulating layer 111, at least one of a thermosetting resin such as an epoxy resin, a thermoplastic resin such as polyimide, a resin in which the thermosetting resin or the thermoplastic resin is impregnated together with inorganic filler in a core material such as a glass fiber (a glass cloth or a glass fabric), for example, prepreg, Ajinomoto Build-up Film (ABF), FR-4, and Bis-maleimide Triazine (BT) may be used.

The first wiring layer 112 may be formed in the first insulating layer 111, for example, may be disposed on the first insulating layer 111, or may be buried in the first insulating layer 111.

When the first substrate portion 110 has a multilayer structure, each of the plurality of first wiring layers 112 may be disposed on each of the plurality of first insulating layers 111. In addition, at least one of the plurality of first wiring layers 112 may be buried in the first insulating layer 111 and exposed to one surface of the first insulating layer 111. For example, as illustrated in FIG. 3, the first wiring layer 112 disposed on the uppermost side among the plurality of first wiring layers 112 may be buried in the first insulating layer 111 disposed on the uppermost side among the plurality of first insulating layers 111 and exposed to an upper surface of the first insulating layer 111, and the remaining first wiring layers 112 may be disposed on lower surfaces of each of the plurality of first insulating layers 111.

The first wiring layer 112 disposed on the uppermost side among the plurality of first wiring layers 112 may include a microcircuit, and a line width of the first wiring layer 112 disposed on the uppermost side among the plurality of first wiring layers 112 may be narrower than the line width of the remaining first wiring layers 112. The first wiring layer 112 including the microcircuit and disposed on the uppermost side may be connected to a pad 122 through a second via 123. Therefore, through the above description, in the printed circuit board 1000A, the electronic components mounted on the pad 122 may be finely connected to each other. At this time, when the first wiring layer 112 disposed on the uppermost side among the plurality of first wiring layers 112 is buried in the first insulating layer 111, it may be more advantageous to implement a microcircuit of the first wiring layer 112.

Meanwhile, when the pad and the microcircuit are formed on the same layer of the printed circuit board, it may be difficult to secure a design area of the microcircuit due to a space limitation of the printed circuit board. At this time, by separating the pad and the microcircuit from each other and forming the pad and the microcircuit on different layers, that is, by disposing only the pad 122 on the uppermost layer of the printed circuit board 1000A, and separately forming the microcircuit on the first wiring layer 112, the design area of the microcircuit may be sufficiently secured.

A material of the first wiring layer 112 may be a conductive material such as copper (Cu), aluminum (Al), silver (Ag), tin (Sn), gold (Au), nickel (Ni), lead (Pb), titanium (Ti), or alloys thereof. The method of forming the first wiring layer 112 is not particularly limited, but the first wiring layer 112 may be formed by forming a first plating layer, serving as a seed layer, by electroless plating or the like and forming a second plating layer on the first plating layer by electroplating or the like. However, the first wiring layer 112 disposed on the uppermost side among the plurality of first wiring layers 112 may be formed by electroplating or the like using a metal foil of a carrier as a seed layer, as will be seen in a process to be described later, and may thus include only a single metal layer.

The first via 113 may penetrate through the first insulating layer 111 and may connect the first wiring layers 112 disposed on different layers to each other.

When the first via 113 is a plurality of first vias 113, each of the plurality of first vias 113 may penetrate through each of the plurality of first insulating layers 111 and may connect the first wiring layers 112 disposed on different layers to each other. The first via 113 disposed on the uppermost side among the plurality of first vias 113 may connect the first wiring layer 112 buried in the first insulating layer 111 disposed on the uppermost side among the plurality of insulating layers 111 and the first wiring layer 112 disposed on a lower surface of the first insulating layer 111 disposed on the uppermost side among the plurality of first insulating layers 111 to each other.

A material of the first via 113 may be a conductive material such as copper (Cu), aluminum (Al), silver (Ag), tin (Sn), gold (Au), nickel (Ni), lead (Pb), titanium (Ti), or alloys thereof. The method of forming the first via 113 is not particularly limited, but the first via 113 may be formed by forming a via hole by laser processing, forming a first plating layer, serving as a seed layer, along a wall of the via hole by electroless plating or the like, and then forming a second plating layer on the first plating layer by electroplating or the like.

As illustrated in FIG. 3, the first via 113 may be integrated with the first wiring layer 112 and may not have a boundary with each other. However, the first via 113 is not limited thereto, and the first via 113 may have a boundary with the first wiring layer 112 and may be distinguished therefrom according to the method of forming the first via 113.

The first via 113 may be a filled-type via in which an inside of a via hole is completely filled with a conductive material, or may be formed of a conductive material along a wall of the via hole. When the first via 113 is formed of a conductive material along the wall of the via hole, the inside of the via hole may be filled with an insulating material. The first via 113 may have a known shape such as a cylindrical shape or a tapered shape.

The second substrate portion 120 may be disposed on the first substrate portion 110 and may include a second insulating layer 121, a pad 122, and a second via 123.

The second insulating layer 121 may be disposed on the first insulating layer 111, and may cover the first wiring layer 112. At this time, the second insulating layer 121 may be disposed on one surface of the first insulating layer 111 to which the first wiring layer 112 is exposed. When the first substrate portion 110 has a multilayer structure, the second insulating layer 121 may be disposed on the first insulating layer 111 disposed on the uppermost side among the plurality of first insulating layers 111 and may cover the first wiring layer 112 disposed on the uppermost side among the plurality of first wiring layers 112.

As a material for forming the second insulating layer 121, at least one of a thermosetting resin such as an epoxy resin, a thermoplastic resin such as polyimide, a resin in which the thermosetting resin or the thermoplastic resin is impregnated together with inorganic filler in a core material such as a glass fiber (a glass cloth or a glass fabric), for example, prepreg, Ajinomoto Build-up Film (ABF), FR-4, and Bis-maleimide Triazine (BT) may be used.

However, as in a process to be described later, the second via 123 may be formed to penetrate through the second insulating layer 121, and thus, it may be advantageous that the second insulating layer 121 does not include glass fibers. From this point of view, ABF may be used as a material for forming the second insulating layer 121.

The first insulating layer 111 and the second insulating layer 121 may include different materials. For example, the first insulating layer 111 may include glass fibers, and the second insulating layer 121 may not include glass fibers. However, the first insulating layer 111 and the second insulating layer 121 are not limited thereto and may include the same material.

A thickness of the first insulating layer 111 and a thickness of the second insulating layer 121 may be the same or different from each other. The thickness of the second insulating layer 121 and may be thicker than the thickness of the first insulating layer 111, but is not limited thereto.

The pad 122 may serve to connect an electronic component mounted on the printed circuit board 1000A to the printed circuit board 1000A.

The pad 122 may be disposed on the second insulating layer 121. Referring to the drawings, the pad 122 may be disposed on an upper surface of the second insulating layer 121, that is, on a surface opposite to a surface of the second insulating layer 121 facing the first insulating layer 111.

A material of forming the pad 122 may be a conductive material such as copper (Cu), aluminum (Al), silver (Ag), tin (Sn), gold (Au), nickel (Ni), lead (Pb), titanium (Ti), or alloys thereof. The method of forming the pad 122 is not particularly limited, but the pad 122 may be formed by forming a first plating layer, serving as a seed layer, by electroless plating or the like and forming a second plating layer on the first plating layer by electroplating or the like.

The second via 123 may penetrate through the second insulating layer 121 and may connect the first wiring layers 112 and the pad 122 to each other. When the first substrate portion 110 has a multilayer structure, the second via 123 may connect the first wiring layer 112 disposed on the uppermost side among the plurality of first wiring layers 112 and the pad 122 to each other.

The second via 123 may be connected to the first wiring layer 112 disposed on the uppermost side among the plurality of first wiring layers 112, and may be formed as a micro-via for fine connection with the first wiring layer 112 including a microcircuit. For example, a diameter of the second via 123 may be 30 µm or less, but is not limited thereto. In addition, a maximum diameter of the second via 123 may be smaller than the maximum diameter of the first via 113.

A material of forming the second via 123 may be a conductive material such as copper (Cu), aluminum (Al), silver (Ag), tin (Sn), gold (Au), nickel (Ni), lead (Pb), titanium (Ti), or alloys thereof.

A method of forming the second via 123 is not particularly limited, but a photolithography process may be used to implement the micro-via. A detailed process will be described in detail with reference to FIGS. 9A through 9J.

The second via 123 may have a boundary with each of the first wiring layer 112 and the pad 122, and may include a first metal layer 123A and a second metal layer 123B disposed on different levels. The first metal layer 123A may contact the first wiring layer 112, and the second metal layer 123B may contact the pad 122. The first metal layer 123A may serve as a seed layer for forming the second metal layer 123B, and a thickness of the first metal layer 123A may be thinner than the thickness of the second metal layer 123B. A side surface of each of the first metal layer 123A and the second metal layer 123B may contact the second insulating layer 121. In the case of using the photolithography process, since a seed layer is not formed on the side surface of the via, the second via 123 may have such a structure.

A material of forming each of the first metal layer 123A and the second metal layer 123B may be a conductive material such as copper (Cu), aluminum (Al), silver (Ag), tin (Sn), gold (Au), nickel (Ni), lead (Pb), titanium (Ti), or alloys thereof. The material of forming each of the first metal layer 123A and the second metal layer 123B may be the same or different from each other.

The second via 123 may be a filled-type via in which an inside of a via hole is completely filled with a conductive material, and the second via 123 may have a known shape such as a cylindrical shape or a tapered shape.

A difference between the maximum diameter and the minimum diameter of the second via 123 may be smaller than a difference between the maximum diameter and the minimum diameter of the first via 113. This is because the difference between the maximum diameter and the minimum diameter of the via is not large when the via is formed using a photography process, compared to the case in which the via is formed using laser processing. In one example, an angle of inclination of a side surface of the first via 113 with respect to a reference surface such as an upper surface of the first insulating layer 111 may be less than an angle of inclination of a side surface of the second via 123 with respect to the reference surface.

Meanwhile, when the via is formed through $CO_2$ laser processing, there is a problem in that it is difficult to form a micro-via. In addition, when the via is formed using an ultraviolet (UV) laser or an excimer laser, the micro-via may be formed, but there are problems such as an increase in a difficulty of aligning vias, a decrease in productivity, and an increase in cost. On the other hand, when the second via 123 is formed through a photolithography process as in the present disclosure, it is possible to easily form the micro-via.

The third substrate portion 130 may be disposed on a side opposite to the side of the first substrate portion 110 on which the second substrate portion 120 is disposed, and may include a third insulating layer 131, a third wiring layer 132, and a third via 133.

The third insulating layer 131 may be disposed on the first insulating layer 111, and may cover the first wiring layer 112. When the first substrate portion 110 has a multilayer structure, the third insulating layer 131 may be disposed on the first insulating layer 111 disposed on the lowermost side among the plurality of first insulating layers 111 and may cover the first wiring layer 112 disposed on the lowermost side among the plurality of first wiring layers 112.

As a material for forming the third insulating layer 131, at least one of a thermosetting resin such as an epoxy resin, a thermoplastic resin such as polyimide, a resin in which the thermosetting resin or the thermoplastic resin is impregnated together with inorganic filler in a core material such as a glass fiber (a glass cloth or a glass fabric), for example, prepreg, Ajinomoto Build-up Film (ABF), FR-4, and Bismaleimide Triazine (BT) may be used.

However, as in a process to be described later, the third insulating layer 131 may be formed to penetrate through the third via 133 similarly to the second via 123, and thus, it may be advantageous that the third insulating layer 131 does not include glass fibers. From this point of view, ABF may be used as a material for forming the third insulating layer 131.

However, the third via 133 may be formed through laser processing and plating similarly to the first via 113, and in this case, a prepreg including glass fibers may be used as a material for forming the third insulating layer 131.

The third insulating layer 131 may include the same material as the first insulating layer 111, or may include a material different from the first insulating layer 111. In addition, the third insulating layer 131 may include the same material as the second insulating layer 121, or may include a material different from the second insulating layer 121.

The third wiring layer 132 may be disposed on the third insulating layer 131. Referring to the drawings, the third wiring layer 132 may be disposed on a lower surface of the third insulating layer 131, that is, on a surface opposite to a surface of the third insulating layer 131 facing the first insulating layer 111.

A material of forming the third wiring layer 132 may be a conductive material such as copper (Cu), aluminum (Al), silver (Ag), tin (Sn), gold (Au), nickel (Ni), lead (Pb), titanium (Ti), or alloys thereof. The method of forming the third wiring layer 132 is not particularly limited, but the third wiring layer 132 may be formed by forming a first plating layer, serving as a seed layer, by electroless plating or the like and forming a second plating layer on the first plating layer by electroplating or the like.

The third via 133 may penetrate through the third insulating layer 131 and may connect the first wiring layers 112 and the third wiring layer 132 to each other. When the first substrate portion 110 has a multilayer structure, the third via 133 may connect the first wiring layer 112 disposed on the lowermost side among the plurality of first wiring layers 112 and the third wiring layer 132 to each other.

A material of forming the third via 133 may be a conductive material such as copper (Cu), aluminum (Al), silver (Ag), tin (Sn), gold (Au), nickel (Ni), lead (Pb), titanium (Ti), or alloys thereof.

A method of forming the third via 133 is not particularly limited, but a photolithography process may be used similarly to the second via 123. To simplify the process, the third via 133 may be formed through the same process as the second via 123. However, the third via 133 is not limited thereto, and for example, the third via 133 may be formed through laser processing and plating, similarly to the first via 113.

The third via 133 may have a boundary with each of the first wiring layer 112 and the third wiring layer 132. The third via 133 may be formed directly on the first wiring layer 112 without a seed layer, and thus may include only a single metal layer. However, the third via 133 is not limited thereto, and may include a plurality of metal layers. In this case, a thickness of the third via 133 may be the same as or similar to the thickness of the second metal layer 123B of the second via 123, but is not limited thereto.

The third via 133 may be a filled-type via in which an inside of a via hole is completely filled with a conductive material, and the second via 133 may have a known shape such as a cylindrical shape or a tapered shape.

A difference between the maximum diameter and the minimum diameter of the third via 133 may be smaller than a difference between the maximum diameter and the minimum diameter of the first via 113. As described above, this is because the difference between the maximum diameter and the minimum diameter of the via is not large when the via is formed using a photography process, compared to the case in which the via is formed using laser processing. In one example, an angle of inclination of a side surface of the first via 113 with respect to a reference surface such as an upper surface of the first insulating layer 111 may be less than an angle of inclination of a side surface of the third via 133 with respect to the reference surface.

However, the third via 133 may also be formed using laser processing and plating, and the difference between the maximum diameter and the minimum diameter of the third via 133 may be similar to the difference between the maximum diameter and the minimum diameter of the first via 113. In this case, the difference between the maximum diameter and the minimum diameter of the third via 133 may be greater than a difference between the maximum diameter and the minimum diameter of the second via 123.

The first protective layer 140 may be disposed on the second substrate portion 120 and may have an opening exposing at least a portion of the pad 122.

The first protective layer 140 may be an Ajinomoto Build-up Film (ABF) layer or a solder resist (SR) layer. However, the first protective layer 140 is not limited thereto, and a known insulating material may be used as a material of forming the first protective layer 140.

The second protective layer 150 may be disposed on the third substrate portion 130 and may have an opening exposing at least a portion of the third wiring layer 132.

The second protective layer 150 may also be an Ajinomoto Build-up Film (ABF) layer or a solder resist (SR) layer. However, the second protective layer 150 is not limited thereto, and a known insulating material may be used as a material of forming the second protective layer 150.

Meanwhile, the printed circuit board 1000A is described based on the configurations included in each of the first to third substrate portions 110, 120, and 130. The printed circuit board 1000A may include a plurality of insulating layers 111, 121, and 131 and a plurality of wiring layers 112, 122, and 132 disposed on each of the plurality of insulating layers 111, 121, and 131. Referring to the drawings, each of the plurality of wiring layers 112, 122, and 132 may be disposed on the lower side of each of the plurality of insulating layers 111, 121, and 131. In addition, the printed circuit board 1000A may further include the pad 122 disposed on the side opposite to the side of the insulating layer 121 disposed on the uppermost side among the plurality of insulating layers 111, 121, and 131 on which the wiring layer 121 is disposed, that is, on an upper side of the insulating layer 121 disposed on the uppermost side among the plurality of insulating layers 111, 121, and 131.

In addition, the printed circuit board 1000A further includes a plurality of vias 113, 123, and 133 for interlayer connection. The plurality of vias 113 and 133 may penetrate through each of the remaining insulating layers 111 and 131 except for the insulating layer 121 disposed on the uppermost side among the plurality of insulating layers 111, 121 and 131, and may connect the wiring layers 112 and 132 disposed on different layers to each other. In addition, the via 123 may penetrate through the insulating layer 121 disposed on the uppermost side among the plurality of insulating layers 111, 121, and 131, and may connect the wiring layer 112 and the pad 122 disposed on the insulating layer 121 to each other. In this case, by forming the via 123 disposed on the uppermost side among the plurality of vias 113, 123, and 133 into as a micro-via, the via 123 may finely connect the electronic component mounted on the pad 122 to the wiring layer 112 including the microcircuit.

Figure 4:
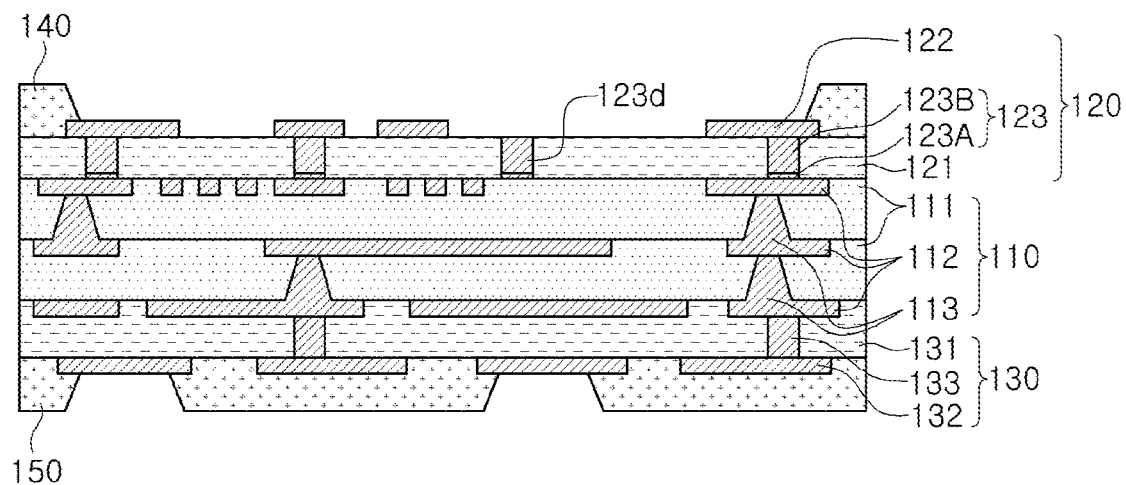
FIG. 4 is a schematic cross-sectional view illustrating another example of the printed circuit board according to the present disclosure.

FIG. 4 is a schematic cross-sectional view illustrating another example of the printed circuit board according to the present disclosure.

Referring to FIG. 4, in a printed circuit board 1000B, the second substrate portion 120 includes a dummy via 123d, as compared to the printed circuit board 1000A.

The dummy via 123d may also serve to improve distribution of a plating thickness. When the second via 123 is formed as a micro-via having a small plating area, it may not be easy to control the distribution of the plating thickness. In this case, by additionally forming the dummy via 123d together with the second via 123, the plating area may be increased, thereby improving the distribution of the plating thickness. The dummy via 123d may be disconnected without being connected to at least one of the pad 122 and the first wiring layer 112. For example, as illustrated in FIG. 4, the dummy via 123d may not be connected to both the pad 122 and the first wiring layer 112. Alternatively, the dummy via 123d may be connected only to the pad 122 and not connected to the first wiring layer 112, or may be connected only to the first wiring layer 112 and not connected to the pad 122.

The dummy via 123d may serve to dissipate heat transferred from an electronic component mounted on the printed circuit board 1000B, and thus, improve heat dissipation characteristics of the printed circuit board 1000B. The pad 122 and/or the first wiring layer 112 may include a signal pattern, and the dummy via 123d may not be electrically connected to the signal pattern. However, the dummy via 123d may be connected to a pattern other than the signal pattern included in the pad 122 and/or the first wiring layer 112 in order to secure a heat dissipation path.

Descriptions of other components may be applied in substantially the same manner as those described above. For example, the structure of the dummy via 123d may be substantially the same as the structure of the second via 123. Detailed descriptions will be omitted.

Figure 5:
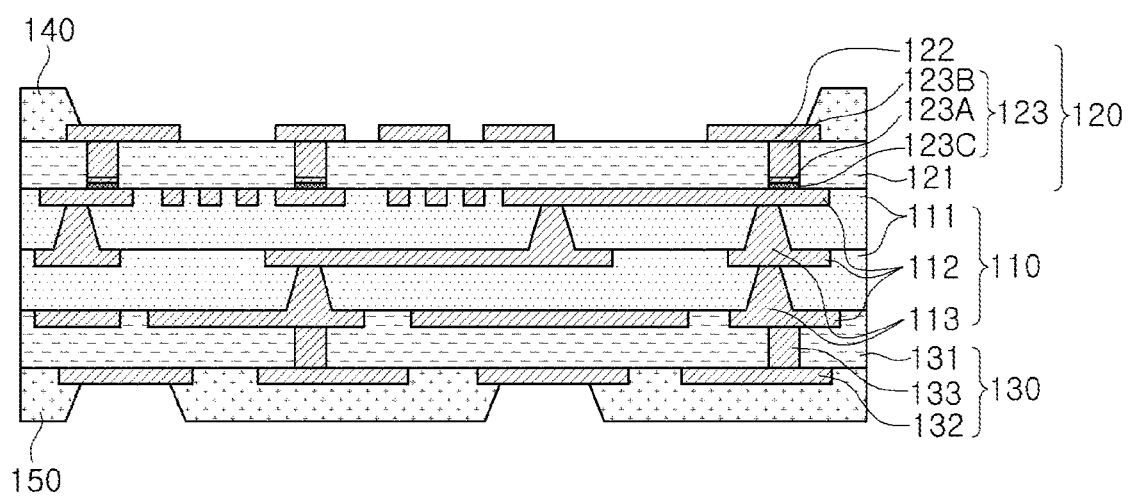
FIG. 5 is a schematic cross-sectional view illustrating another example of the printed circuit board according to the present disclosure.

FIG. 5 is a schematic cross-sectional view illustrating another example of the printed circuit board according to the present disclosure.

Referring to FIG. 5, in the printed circuit board 1000C, the second via 123 may include a first metal layer 123A, a second metal layer 123B, and a third metal layer 123C.

The third metal layer 123C may be disposed on a different level from each of the first metal layer 123A and the second metal layer 123B. Specifically, the second via 123 may have a structure in which the third metal layer 123C, the first metal layer 123A, and the second metal layer 123B are sequentially stacked, and the third metal layer 123C may be disposed between the first metal layer 123A and the first wiring layer 112 to contact the first wiring layer 112. That is, in the printed circuit board 1000C, the third metal layer 123C, rather than the first metal layer 123A, may contact the first wiring layer 112. A side surface of the third metal layer 123C may also contact the second insulating layer 121. As described above, by forming the second via 123 through a photolithography process, the second via 123 may have such a structure.

A thickness of the third metal layer 123C may be thinner than that of the second metal layer 123B. In addition, the thickness of the third metal layer 123C may be the same as or similar to the thickness of the first metal layer 123A.

A material of forming the third metal layer 123C may be a conductive material such as copper (Cu), aluminum (Al), silver (Ag), tin (Sn), gold (Au), nickel (Ni), lead (Pb), titanium (Ti), or alloys thereof. When the third metal layer 123C is formed of a material having oxidation characteristics, an oxidation prevention layer such as a copper (Cu) layer may be additionally formed on the third metal layer 123C.

At least two of the first metal layer 123A, the second metal layer 123B, and the third metal layer 123C may include different materials. In addition, the third metal layer 123C may include a material different from that of the first wiring layer 112. For example, the third metal layer 123C may be a nickel (Ni) layer, and each of the first metal layer 123A and the first wiring layer 112 may be a copper (Cu) layer, but is not limited thereto.

As may be seen in a process to be described later, when the second via 123 is formed through a photolithography process, a portion of the first metal layer 123A may be removed by etching or the like. In this case, since the first wiring layer 112 is etched together, there may be a problem that the thickness of the first wiring layer 112 is decreased. When the third metal layer 123C is additionally formed between the first metal layer 123A and the first wiring layer 112 as in the present disclosure, the third metal layer 123C may serve as an etching barrier, and thus, the thickness of the first wiring layer 112 may be secured.

Descriptions of other components may be applied in substantially the same manner as those described above, and detailed descriptions will be omitted.

Figure 6:
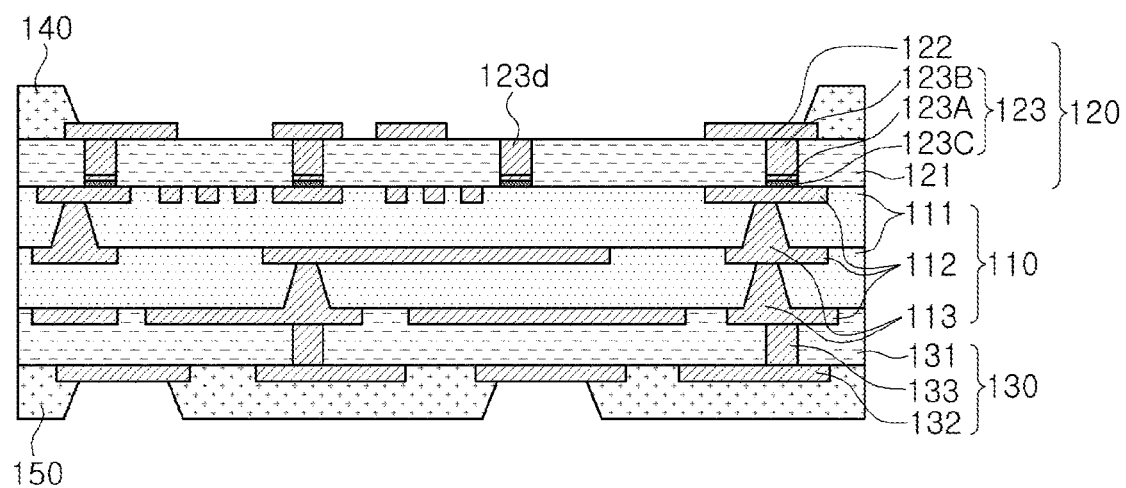
FIG. 6 is a schematic cross-sectional view illustrating another example of the printed circuit board according to the present disclosure.

FIG. 6 is a schematic cross-sectional view illustrating another example of the printed circuit board according to the present disclosure.

Referring to FIG. 6, in a printed circuit board 1000D, the second substrate portion 120 may include a dummy via 123d, as compared to the printed circuit board 1000C.

Descriptions of other components may be applied in substantially the same manner as those described above, and detailed descriptions will be omitted.

Figure 7:
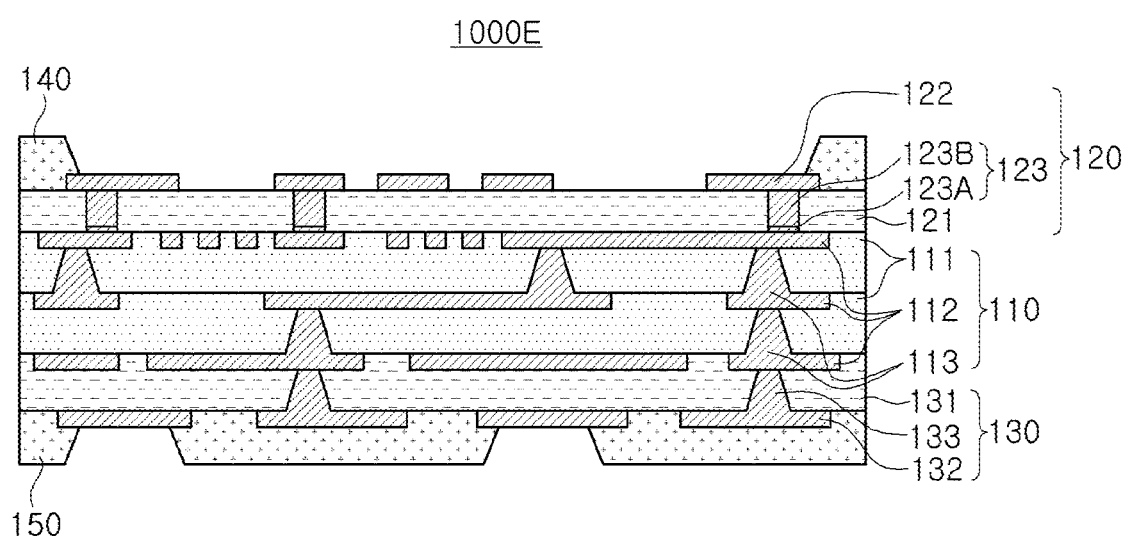
FIG. 7 is a schematic cross-sectional view illustrating another example of the printed circuit board according to the present disclosure.

FIG. 7 is a schematic cross-sectional view illustrating another example of the printed circuit board according to the present disclosure.

Referring to FIG. 7, in a printed circuit board 1000E, the third via 133 may have a different shape as compared to the printed circuit board 1000A.

The method of forming the third via 133 is not particularly limited, but the third via 133 may be formed by forming a via hole by laser processing, forming a first plating layer, serving as a seed layer, along a wall of the via hole by electroless plating or the like, and then forming a second plating layer on the first plating layer by electroplating or the like.

As illustrated in FIG. 7, the third via 133 may be integrated with the third wiring layer 132 and may not have a boundary therebetween. However, the third via 133 is not limited thereto, and the third via 133 may have a boundary with the third wiring layer 132 and may be distinguished from each other according to the method of forming the third via 133.

Meanwhile, the third via 133 may not be a micro-via, and in this case, when the third via 133 is formed through a photolithography process, it may be difficult for the third insulating layer 131 stacked after the formation of the third via 133 to penetrate through the third insulating layer 131. Accordingly, in the case of the printed circuit board 1000E, such a problem may be prevented by forming the third via 133 through another process such as laser processing.

Descriptions of other components may be applied in substantially the same manner as those described above, and detailed descriptions will be omitted.

Figure 8:
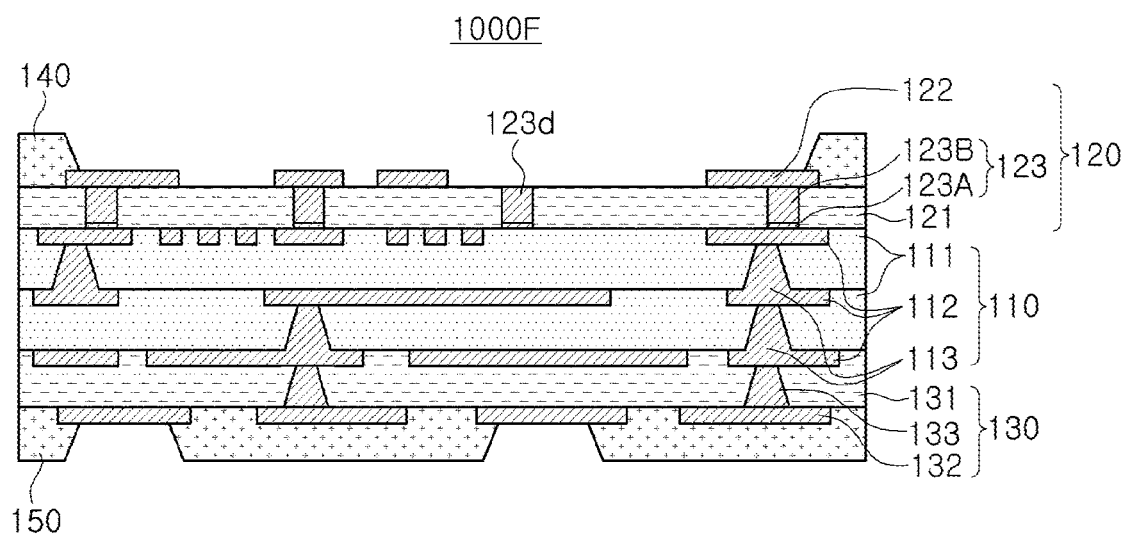
FIG. 8 is a schematic cross-sectional view illustrating another example of the printed circuit board according to the present disclosure.

FIG. 8 is a schematic cross-sectional view illustrating another example of the printed circuit board according to the present disclosure.

Referring to FIG. 8, in a printed circuit board 1000F, the second substrate portion 120 may include a dummy via 123d as compared to the printed circuit board 1000E.

Descriptions of other components may be applied in substantially the same manner as those described above, and detailed descriptions will be omitted.

FIGS. 9A through 9J are schematic cross-sectional views illustrating an example of a process of manufacturing a printed circuit board according to the present disclosure.

Figure 9A:
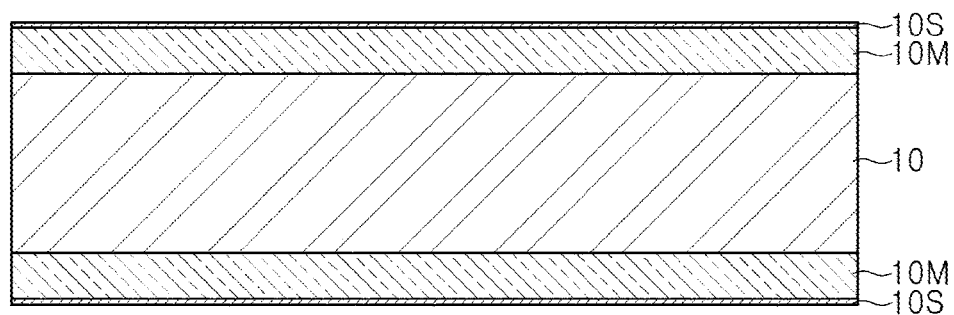
FIGS. 9A through 9J are schematic cross-sectional views illustrating an example of a process of manufacturing a printed circuit board according to the present disclosure.

Referring to FIG. 9A, first, a carrier in which a carrier metal foil 10M and a metal foil 10S are stacked on a carrier film 10 may be prepared.

The carrier metal foil 10M and the metal foil 10S may be formed on one side or both sides of the carrier film 10. Each of the carrier metal foil 10M and the metal foil 10S may be a copper foil formed of copper (Cu), but is not limited thereto, and may be formed of another conductive material such as aluminum (Al).

The following process is described based on the metal foil 10S disposed on a lower side of the carrier film 10 in the drawings, but the same process may be applied to the metal foil 10S disposed on an upper side of the carrier film 10.

Figure 9B:
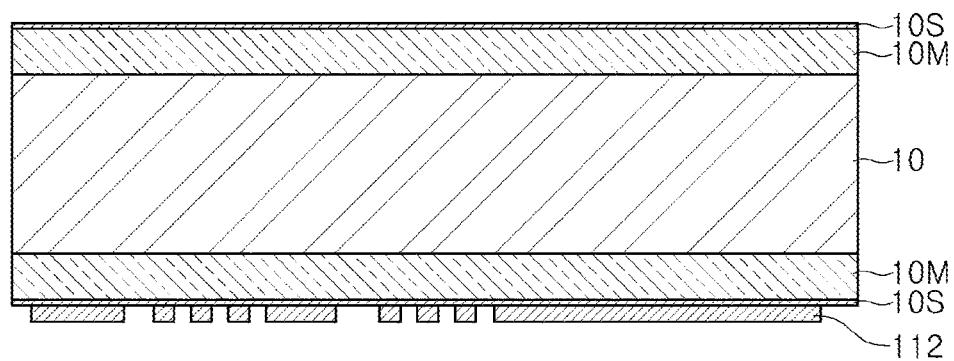

Next, referring to FIG. 9B, a first wiring layer 112 may be formed on the metal foil 10S.

The first wiring layer 112 may be formed by performing electroplating or the like on the metal foil 10S. In this case, the metal foil 10S may serve as a seed layer, and therefore, the first wiring layer 112 may have a structure including only a single metal layer without including a separate seed layer.

Figure 9C:
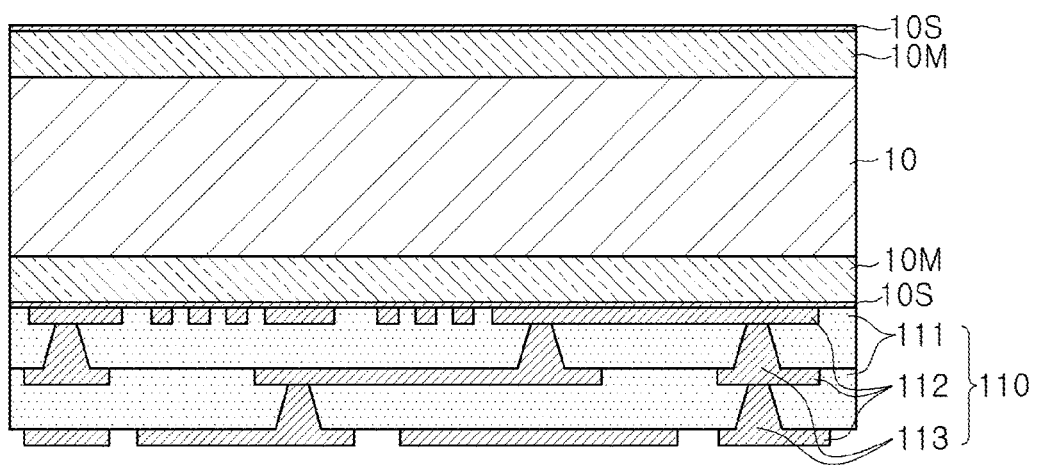

Next, referring to FIG. 9C, a plurality of first insulating layers 111, a plurality of first wiring layers 112, and a plurality of third vias 133 may be formed on the previously formed first wiring layer 112.

The plurality of first insulating layers 111 may be formed by stacking prepregs. During stacking, the prepreg may be in a semi-cured state (B-stage).

The first wiring layer 112 may be formed by forming a first plating layer, serving as a seed layer, by electroless plating or the like and forming a second plating layer on the first plating layer by electroplating and the like. Therefore, the remaining first wiring layers 112 except for the first wiring layer 112 disposed on the uppermost side among the plurality of first wiring layers 112 may have a multilayer structure.

The first via 113 may be formed by forming a via hole by laser processing, forming a first plating layer, serving as a seed layer, along a wall of the via hole by electroless plating or the like, and then forming a second plating layer on the first plating layer by electroplating or the like.

Figure 9D:
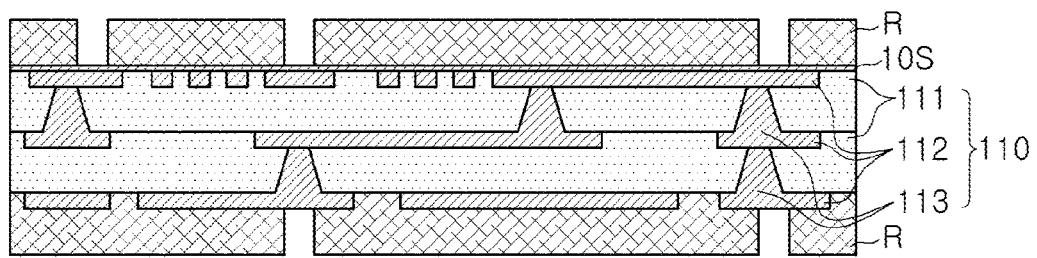

Next, referring to FIG. 9D, the metal foil 10S and the carrier metal foil 10M may be separated. In addition, a resist layer R may be formed on the metal foil 10S and the first insulating layer 111 disposed on the lowermost side among the plurality of first insulating layers 111. The resist layer R may have openings in regions corresponding to each of the second via 123 and the third via 133.

The resist layer R may be formed by attaching a dry film to the metal foil 10S and the first insulating layer 111 and forming an opening in the dry film through exposure and development processes.

Figure 9E:
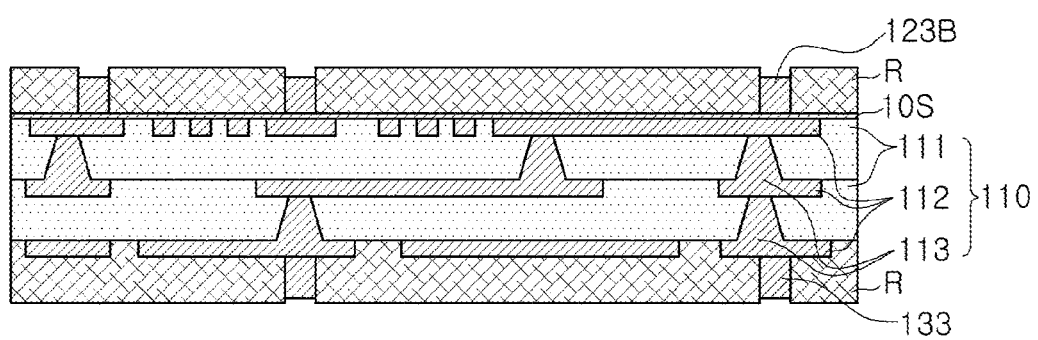

Next, referring to FIG. 9E, a second metal layer 123B and a third via 133 may be formed in the opening of the dry film.

The second metal layer 123B may be performed on the metal foil 10S through electroplating or the like, and the third via 133 may be performed on the first wiring layer 112 through electroplating or the like.

Figure 9F:
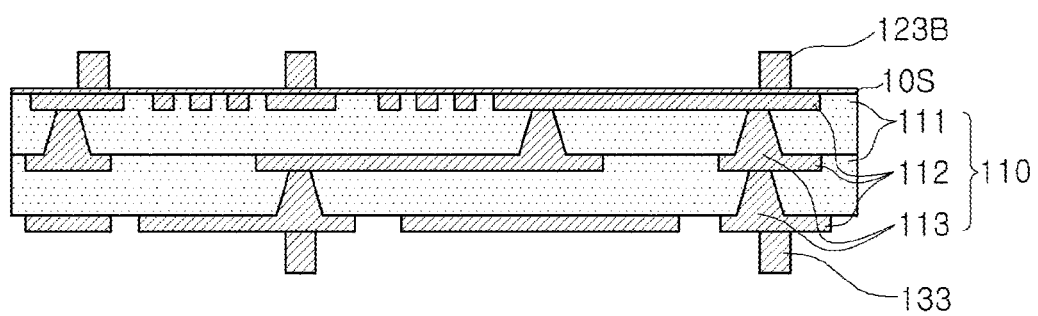

Next, referring to FIG. 9F, the resist layer R may be removed. The resist layer R can be removed by peeling or the like.

Figure 9G:
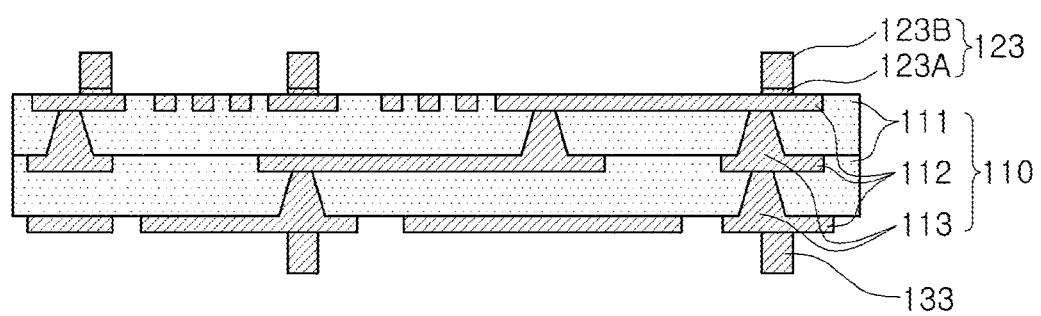

Next, referring to FIG. 9G, a first metal layer 123A may be formed.

The first metal layer 123A may be formed by removing the remaining regions of the metal foil 10S except for the region corresponding to the second metal layer 123B by etching or the like. In this case, at least a portion of the first wiring layer 112 disposed on the uppermost side among the plurality of first wiring layers 112 may be exposed.

Figure 9H:
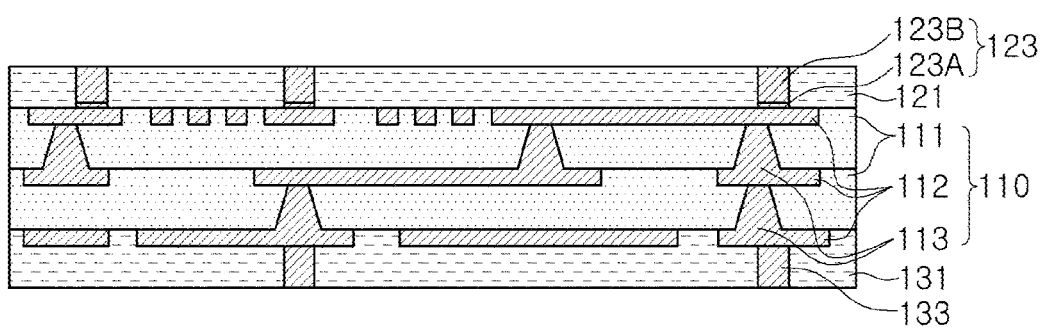

Next, referring to FIG. 9H, a second insulating layer 121 and a third insulating layer 131 may be formed.

Each of the second insulating layer 121 and the third insulating layer 131 may be formed by stacking materials of each of the second insulating layer 121 and the third insulating layer 131 on each of the first insulating layer 111 disposed on the uppermost side among the plurality of first insulating layers 111 and the first insulating layer 111 disposed on the lowermost side among the plurality of first insulating layers 111. In this case, each of the second insulating layer 121 and the third insulating layer 131 may be formed to be penetrated by each of the second via 123 and the third via 133, and thus, it may be advantageous that the second insulating layer 121 and the third insulating layer 131 do not include glass fibers. In addition, after stacking each of the second insulating layer 121 and the third insulating layer 131, a desmearing process may be additionally performed.

Figure 9I:
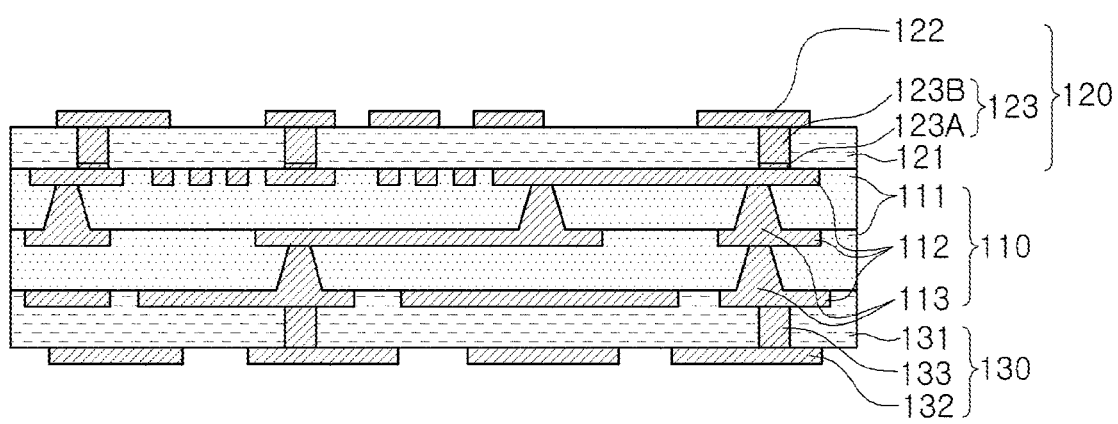
Figure 9J:
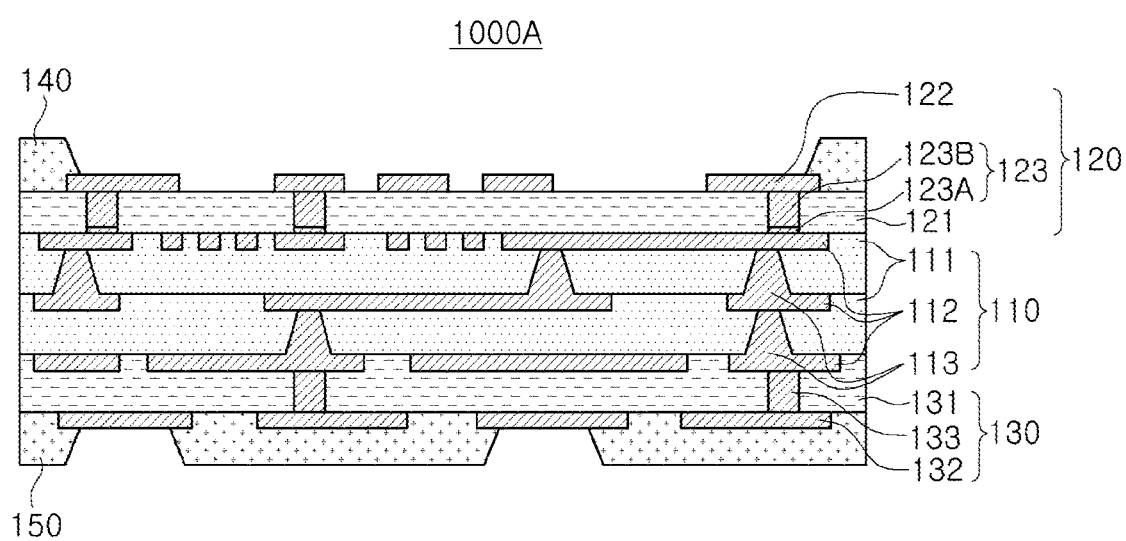

Next, referring to FIG. 9I, a pad 122 and a third wiring layer 132 may be formed on the second insulating layer 121 and the third insulating layer 131, respectively.

The pad 122 and the third wiring layer 132 may be formed by forming a first plating layer, serving as a seed layer, by electroless plating or the like and forming a second plating layer on the first plating layer by electroplating or the like.

Next, a first protective layer 140 and a second protective layer 150 having openings, respectively, exposing at least a portion of each of the pad 122 and the third wiring layer 132 may be formed on the second insulating layer 121 and the third insulating layer 131, respectively.

Each of the first protective layer 140 and the second protective layer 150 may be formed by applying a solder resist, but is not limited thereto.

FIGS. 10A through 10J are schematic cross-sectional views illustrating another example of a process of manufacturing a printed circuit board according to the present disclosure.

Figure 10A:
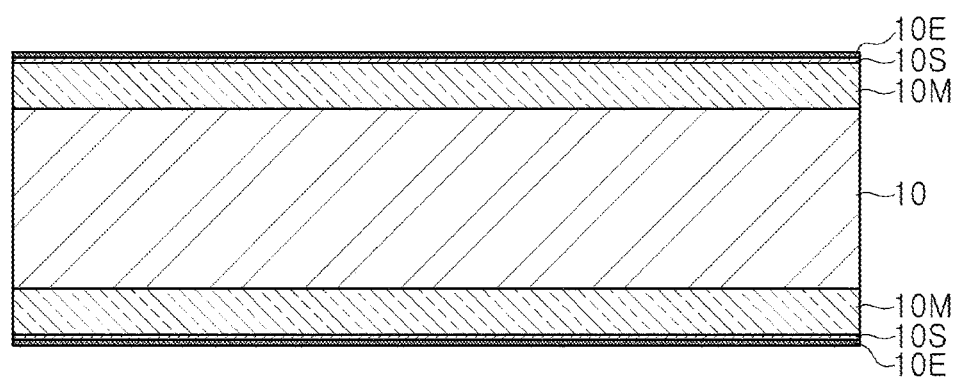
FIGS. 10A through 10J are schematic cross-sectional views illustrating another example of a process of manufacturing a printed circuit board according to the present disclosure.

Referring to FIG. 10A, in the process of manufacturing the printed circuit board according to another exemplary embodiment, a carrier in which a carrier metal layer 10M, a first metal foil 10S, and a second metal foil 10E are stacked on the carrier film 10 may be prepared.

The second metal foil 10E may be formed of a material different from the first metal foil 10S, and may be formed of, for example, titanium (Ti), nickel (Ni), or the like.

Figure 10B:
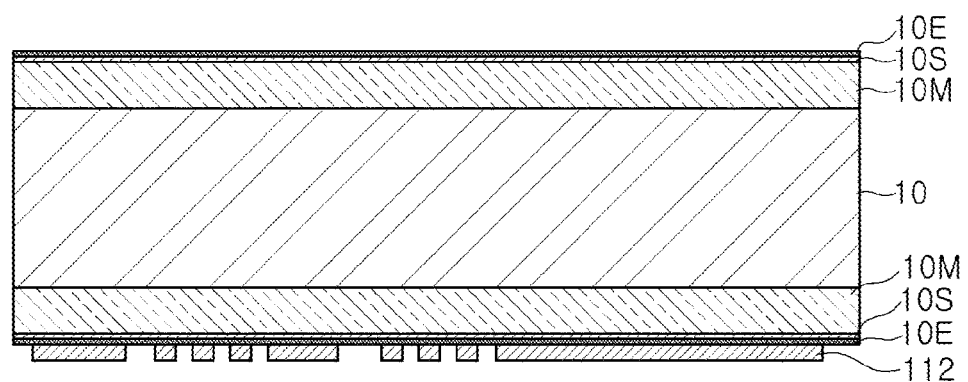
Figure 10C:
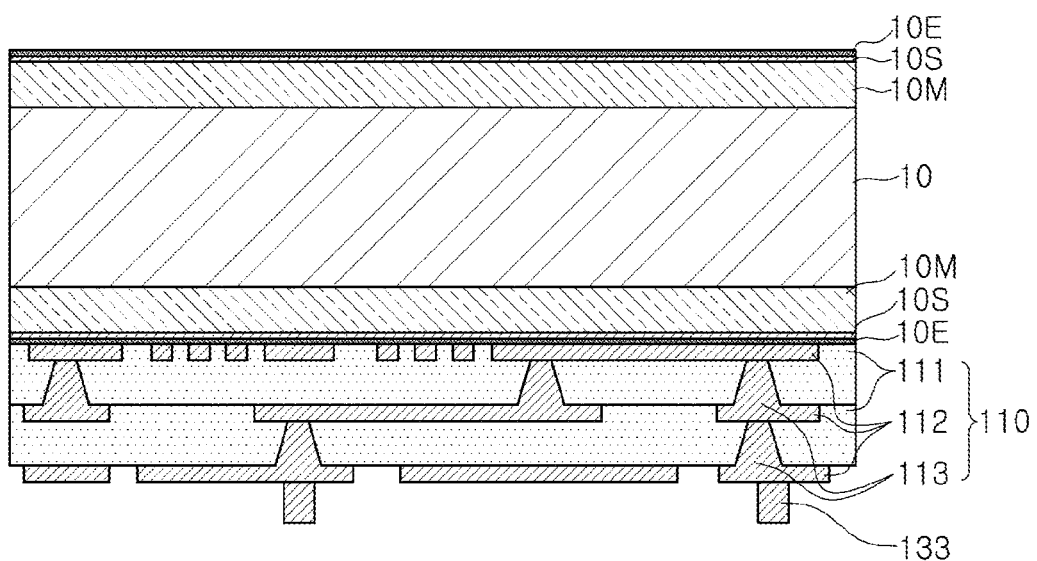
Figure 10D:
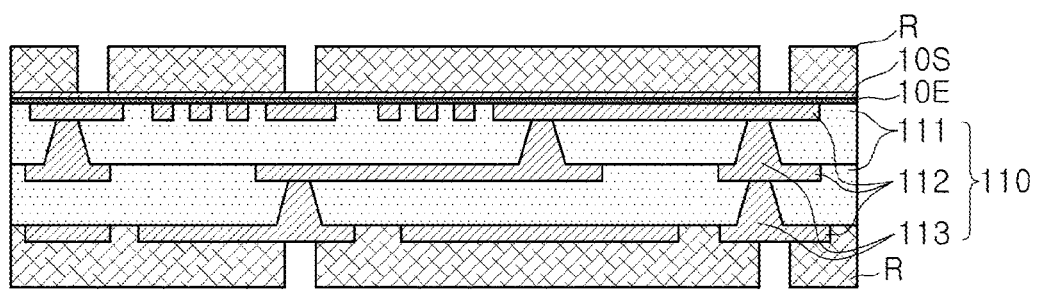
Figure 10E:
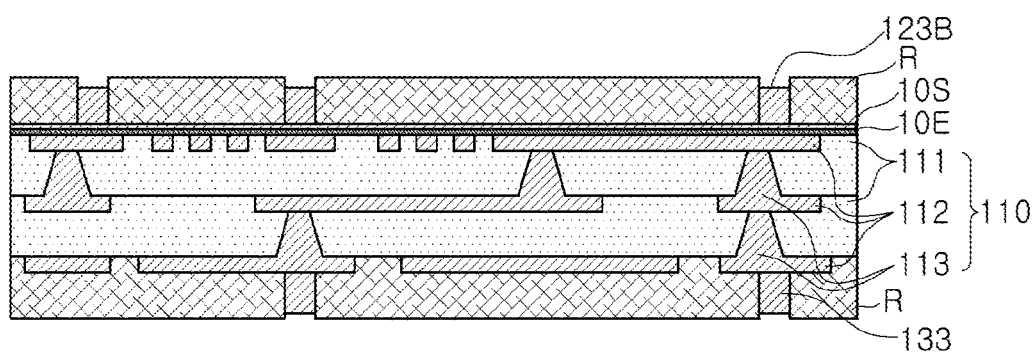
Figure 10F:
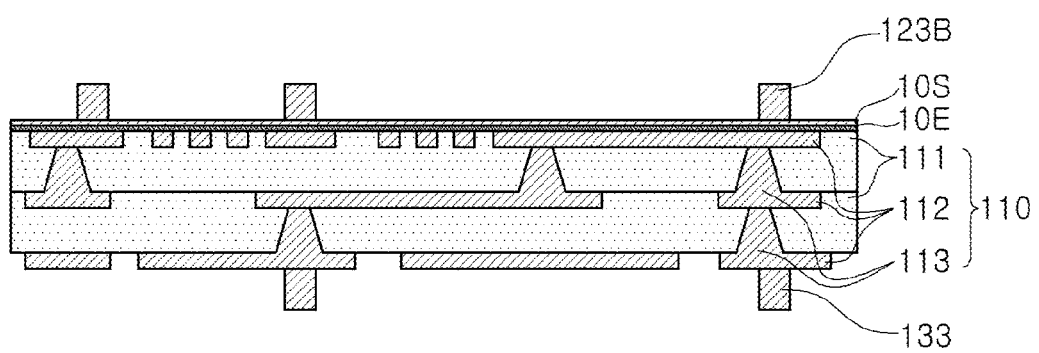

In addition, referring to FIG. 10B, in the process of manufacturing the printed circuit board according to another exemplary embodiment, a first wiring layer 112 may be formed on the second metal foil 10E.

Figure 10G:
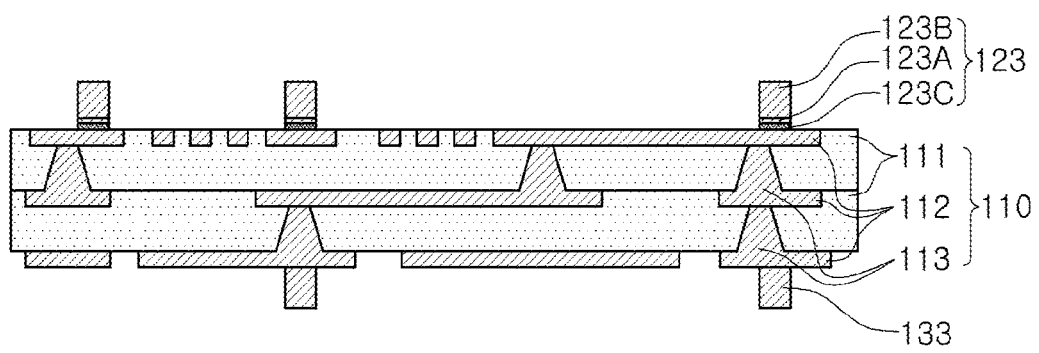
Figure 10H:
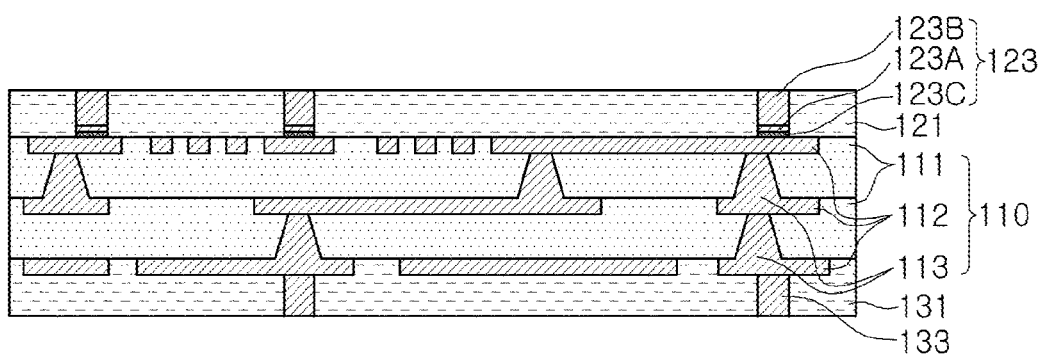
Figure 10I:
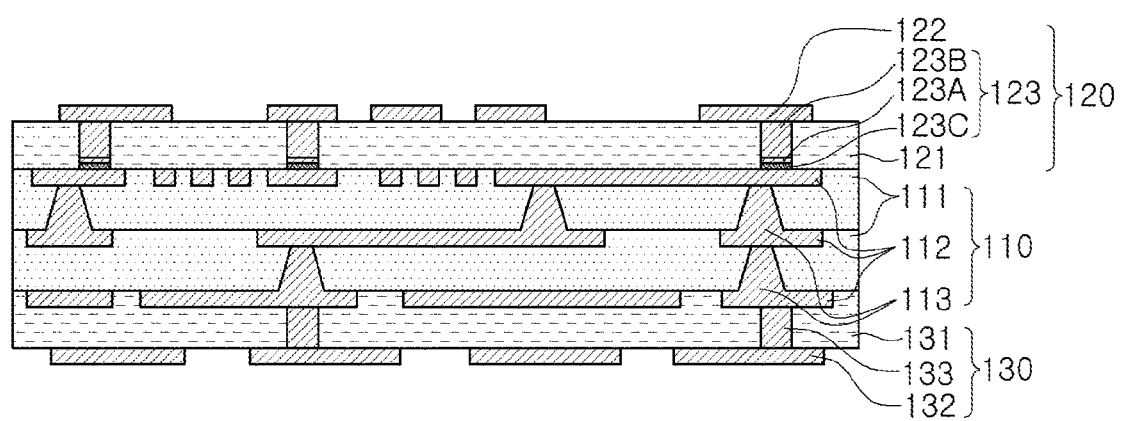
Figure 10J:
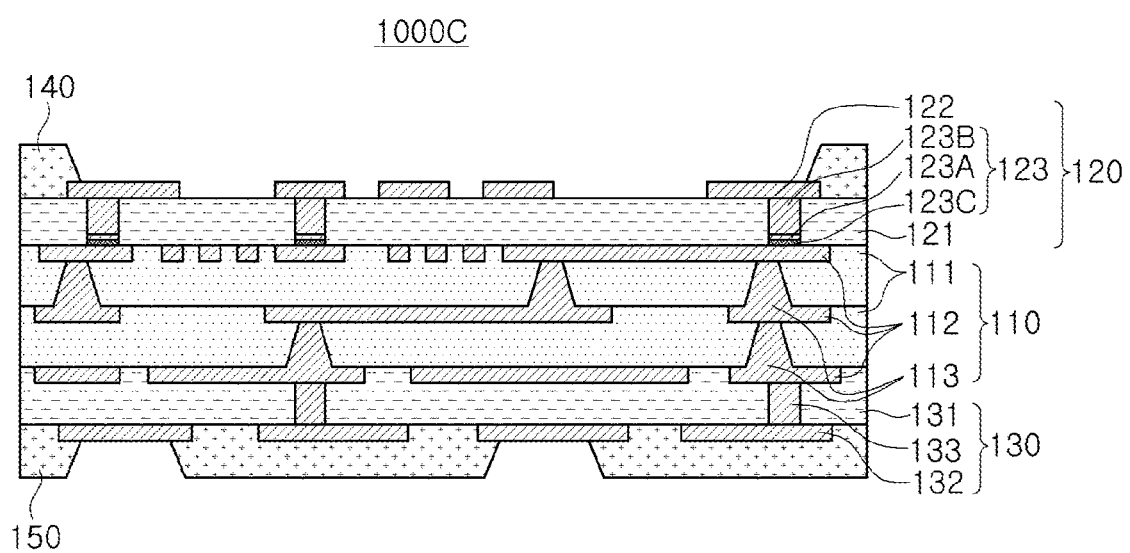

In addition, referring to FIG. 10G, in the process of manufacturing the printed circuit board according to another exemplary embodiment, in addition to the first metal layer 123A, a third metal layer 123C may also be formed. The third metal layer 123C may be formed by removing the remaining regions of the second metal foil 10E except for the region corresponding to the second metal layer 123B by etching or the like. In this case, the second metal foil 10E may be formed of a material different from the first metal foil 10S, and thus may be removed using a different etching solution. In addition, the second metal foil 10E may be formed of a material different from the first wiring layer 112 disposed on the uppermost side among the plurality of first wiring layers 112, and may prevent a side effect of etching the first wiring layer 112 together, when the second metal foil 10E is etched.

Descriptions of other components may be applied in substantially the same manner as those described above in FIGS. 9A through 9J, and detailed descriptions will be omitted.

Figure 11:
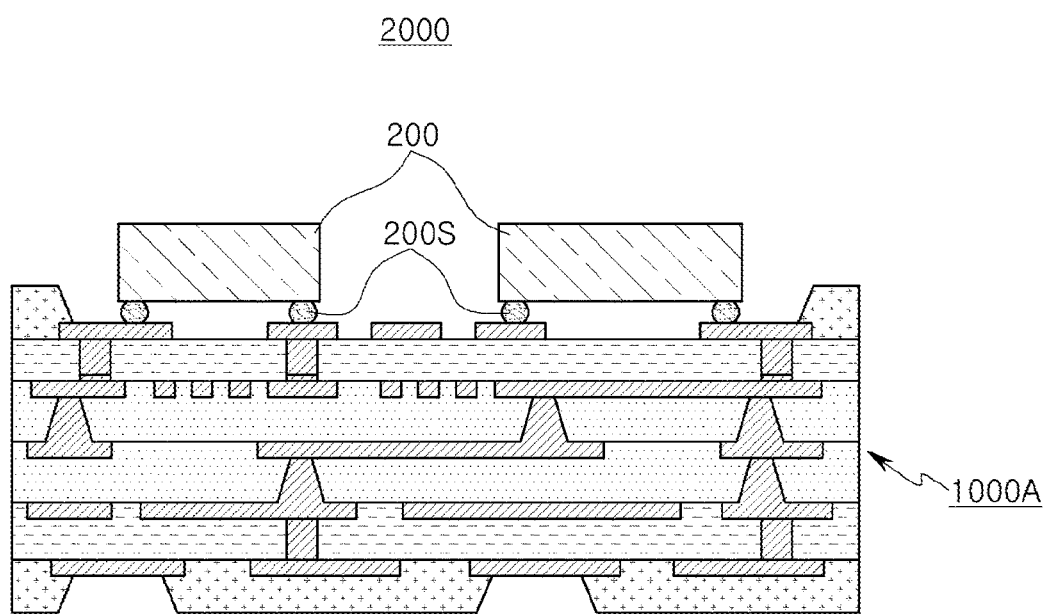
FIG. 11 is a schematic cross-sectional view illustrating an example of a structure in which an electronic component is mounted on the printed circuit board according to the present disclosure.

FIG. 11 is a schematic cross-sectional view illustrating an example of a structure in which an electronic component is mounted on the printed circuit board according to the present disclosure.

Referring to FIG. 11, at least one electronic component 200 may be mounted on the printed circuit board 1000A. In this case, the electronic component 200 may be mounted through a connection conductor 200S.

The plurality of electronic components 200 may be disposed on the pad 122 and may be connected to each other through the first wiring layer 112 including a microcircuit. In this case, the microcircuit and the pad 122 may be connected to each other through the second via 123, and the electronic components 200 may be finely connected to each other on the printed circuit board 1000A by implementing the second via 123 as the micro-via as described above.

The electronic component 200 may be an active component, for example, a plurality of dies. However, the electronic component 200 is not limited thereto, and may be a passive component such as a capacitor or an inductor.

The connection conductor 210 may be formed of solder, but is not limited thereto, and a conductive material may be used without limitation.

In the present specification, the expression that it is disposed on a certain component is not intended to set a direction. Accordingly, the expression that it is disposed on a certain component may mean that it is disposed on the upper side of the certain component or may mean that it is disposed on the lower side thereof.

In the present specification, terms such as upper surface, lower surface, upper side, lower side, uppermost side, and lowermost side are directions set based on the drawings for convenience of description. Accordingly, the upper surface, lower surface, upper side, lower side, uppermost side, lowermost side, and the like may be described in different terms according to the setting direction.

In the present specification, the meaning of a "connection" of a component to another component includes an indirect connection through a third component as well as a direct connection between two components. In addition, "electrically connected" means the concept including a physical connection and a physical disconnection.

In the present disclosure, terms "first", "second", and the like, are used to distinguish one component from another component, and do not limit a sequence, importance, and the like, of the corresponding components. According to the description, a first component may be named a second component and a second component may also be similarly named a first component.

The term "an exemplary embodiment" used herein does not refer to the same exemplary embodiment, and is used to emphasize a particular feature or characteristic different from that of another exemplary embodiment. However, the exemplary embodiments presented above are not excluded from being implemented in combination with features of another exemplary embodiment. For example, even if a matter described in a specific exemplary embodiment is not described in another exemplary embodiment, it may be understood as a description related to another exemplary embodiment unless there is a description opposing or contradicting the matter in another exemplary embodiment.

Terms used in the present specification are used to describe an exemplary embodiment, and are not intended to limit the present disclosure. In this case, singular expressions include plural expressions unless the context clearly indicates otherwise.

As set forth above, according to the exemplary embodiment in the present disclosure, the printed circuit board including the microcircuits and/or the micro-vias may be provided.

According to the exemplary embodiment in the present disclosure, the printed circuit board capable of sufficiently securing the design area of the microcircuit may be provided.

According to the exemplary embodiment in the present disclosure, the printed circuit board having the improved heat dissipation effect may be provided.

According to the exemplary embodiment in the present disclosure, the printed circuit board capable of preventing the side effect of etching the wiring layer together when the seed layer is etched may be provided.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a first substrate portion including a first insulating layer and a first wiring layer; and
   a second substrate portion disposed on the first substrate portion and including a second insulating layer, a pad disposed on an upper outer surface of the second insulating layer, and a first via penetrating through the second insulating layer and connecting the first wiring layer and the pad to each other,
   wherein the first via has a boundary with each of the first wiring layer and the pad, and includes a first metal layer and a second metal layer disposed on different levels, and
   the first wiring layer directly contacts a lower surface of the second insulating layer.

2. The printed circuit board of claim 1, wherein a side surface of each of the first metal layer and the second metal layer is in contact with the second insulating layer.

3. The printed circuit board of claim 1, wherein the first via further includes a third metal layer disposed at a level different from each of the first metal layer and the second metal layer.

4. The printed circuit board of claim 3, wherein at least two of the first metal layer, the second metal layer, and the third metal layer include different materials.

5. The printed circuit board of claim 1, wherein the first wiring layer is buried in the first insulating layer and exposed to one surface of the first insulating layer.

6. The printed circuit board of claim 1, wherein the first via has a diameter of 30 μm or less.

7. The printed circuit board of claim 1, wherein the second substrate portion further includes a dummy via penetrating through the second insulating layer and disconnected from at least one of the first wiring layer and the pad.

8. The printed circuit board of claim 1, wherein the first insulating layer and the second insulating layer include different materials.

9. The printed circuit board of claim 1, wherein the first substrate portion further includes a second wiring layer disposed on the first insulating layer and a second via penetrating through the first insulating layer and connecting the first wiring layer and the second wiring layer to each other.

10. The printed circuit board of claim 9, wherein the first wiring layer has a line width narrower than that of the second wiring layer.

11. The printed circuit board of claim 9, wherein the first via has a maximum diameter smaller than that of the second via.

12. The printed circuit board of claim 9, further comprising a third substrate portion including a third insulating layer disposed on the first insulating layer to cover the second wiring layer, a third wiring layer disposed on the third insulating layer, and a third via penetrating through the third insulating layer and connecting the second wiring layer and the third wiring layer to each other,
wherein the first insulating layer and the third insulating layer include different materials.

13. The printed circuit board of claim 12, wherein the third via has a boundary with the second wiring layer.

14. The printed circuit board of claim 13, wherein the third via has a boundary with the third wiring layer.

15. A printed circuit board comprising:
a plurality of insulating layers including a first insulating layer disposed on an uppermost side among the plurality of insulating layers;
a plurality of wiring layers respectively disposed on the plurality of insulating layers, the plurality of wiring layers including a first wiring layer disposed on a first side of the first insulating layer, the first wiring layer being disposed on an outer surface of the first insulating layer;
a pad disposed on a second side opposite to the first side of the first insulating layer;
a plurality of first vias penetrating through each of the remaining insulating layers except for the first insulating layer among the plurality of insulating layers and connecting wiring layers disposed on different layers among the plurality of wiring layers to each other; and
a second via penetrating through the first insulating layer and connecting the first wiring layer disposed on the first insulating layer and the pad to each other,
wherein the second via has a maximum diameter smaller than that of the first via, and
the first wiring layer directly contacts a lower surface of the first insulating layer.

16. The printed circuit board of claim 15, wherein the second via includes a first metal layer in contact with the first wiring layer disposed on the first insulating layer and a second metal layer in contact with the pad, and
the first metal layer has a thickness smaller than that of the second metal layer.

17. The printed circuit board of claim 16, wherein the plurality of insulating layers further comprise a second insulating layer disposed on the outer surface of the first insulating layer, and
wherein the first insulating layer and the second insulating layer include different materials.

18. A printed circuit board comprising:
a first substrate portion including a first insulating layer, a first wiring layer, and a first via disposed in the first insulating layer and connected to the first wiring layer; and
a second substrate portion disposed on one side of the first substrate portion and including a second insulating layer, a pad disposed on an upper outer surface of the second insulating layer, and a second via disposed in the second insulating layer and connecting the first wiring layer and the pad to each other,
wherein an angle of inclination of a side surface of the first via with respect to an upper surface of the first insulating layer facing the second insulating layer is less than an angle of inclination of a side surface of the second via with respect to the upper surface of the first insulating layer, and
the first wiring layer directly contacts a lower surface of the second insulating layer.

19. The printed circuit board of claim 18, wherein the second via includes a plurality of metal layers, and a side surface of each of the plurality of metal layers is in contact with the second insulating layer.

20. The printed circuit board of claim 18, wherein the first wiring layer is buried in the first insulating layer and exposed to the upper surface of the first insulating layer.

21. The printed circuit board of claim 18, wherein the second substrate portion further includes a dummy via disposed in the second insulating layer and spaced apart from one of the first wiring layer and the pad.

22. The printed circuit board of claim 18, wherein the first insulating layer and the second insulating layer include different materials.

23. The printed circuit board of claim 18, wherein a width of the first via increases in a direction from the second insulating layer to the first insulating layer.

24. The printed circuit board of claim 18, further comprising a third substrate portion including a third insulating layer disposed on another side of the first substrate portion opposing the one side of the first substrate portion, a third wiring layer disposed on the third insulating layer, and a third via disposed in the third insulating layer and connected to the third wiring layer,
wherein the angle of inclination of the side surface of the first via with respect to the upper surface of the first insulating layer facing the second insulating layer is less than an angle of inclination of a side surface of the third via with respect to the upper surface of the first insulating layer.

25. A printed circuit board comprising:
a first substrate portion including a first insulating layer, a first wiring layer, and a first via disposed in the first insulating layer and connected to the first wiring layer; and
a second substrate portion disposed on one side of the first substrate portion and including a second insulating layer, a pad disposed on an upper outer surface of the second insulating layer, and a second via disposed in the second insulating layer and connecting the first wiring layer and the pad to each other,
wherein the number of metal layers being in contact with the first insulating layer and included in the first via is less than the number of metal layers being in contact with the second insulating layer and included in the second via, and
the first wiring layer directly contacts a lower surface of the second insulating layer.

26. The printed circuit board of claim 25, wherein the second substrate portion further includes a dummy via disposed in the second insulating layer and spaced apart from one of the first wiring layer and the pad.

27. The printed circuit board of claim 25, wherein the first insulating layer and the second insulating layer include different materials.

28. The printed circuit board of claim 25, further comprising a third substrate portion including a third insulating layer disposed on another side of the first substrate portion opposing the one side of the first substrate portion, a third wiring layer disposed on the third insulating layer, and a third via disposed in the third insulating layer and connected to the third wiring layer, wherein the second insulating layer and the third insulating layer include different materials.

29. The printed circuit board of claim 1, wherein:
the first wiring layer is embedded in an upper portion of the first insulating layer,
an upper surface of the first wiring layer is exposed from an upper surface of the first insulating layer;
the pad protrudes from the upper outer surface of the second insulating layer; and
the first via has a pillar shape, and a width of an upper surface thereof and a width of a lower surface thereof are substantially same.

\* \* \* \* \*